US012268065B2

United States Patent
Jo (10) Patent No.: US 12,268,065 B2
(45) Date of Patent: Apr. 1, 2025

(54) DISPLAY PANEL AND DISPLAY DEVICE INCLUDING THE SAME

(71) Applicant: LG DISPLAY CO., LTD., Seoul (KR)

(72) Inventor: Boeun Jo, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 17/752,000

(22) Filed: May 24, 2022

(65) Prior Publication Data

US 2023/0209922 A1 Jun. 29, 2023

(30) Foreign Application Priority Data

Dec. 27, 2021 (KR) .......................... 10-2021-0188472

(51) Int. Cl.
| | | |
|---|---|---|
| H10K 59/131 | (2023.01) | |
| H01L 25/18 | (2023.01) | |
| H10K 59/40 | (2023.01) | |
| H10K 77/10 | (2023.01) | |

(52) U.S. Cl.
CPC ............ *H10K 59/131* (2023.02); *H01L 25/18* (2013.01); *H10K 59/40* (2023.02); *H10K 77/111* (2023.02)

(58) Field of Classification Search
None
See application file for complete search history.

(56) References Cited

U.S. PATENT DOCUMENTS

| | | | | |
|---|---|---|---|---|
| 2006/0001792 A1* | 1/2006 | Choi | .................. | G02F 1/13458 257/E27.111 |
| 2008/0291349 A1* | 11/2008 | Kim | .................. | G02F 1/13458 349/152 |
| 2014/0117316 A1* | 5/2014 | Choi | .................. | H10K 59/122 438/26 |
| 2014/0306260 A1* | 10/2014 | Yamazaki | ............ | H10K 59/131 257/99 |
| 2015/0255527 A1* | 9/2015 | Oooka | .................. | G09G 3/006 438/18 |
| 2017/0213873 A1* | 7/2017 | Bok | .................. | H10K 59/1213 |
| 2017/0255309 A1* | 9/2017 | Park | .................. | G06F 1/1652 |
| 2018/0286939 A1* | 10/2018 | Lee | .................. | H01L 22/34 |
| 2019/0006390 A1* | 1/2019 | Park | .................. | H01L 29/41733 |
| 2020/0403180 A1* | 12/2020 | Seon | .................. | H10K 50/844 |
| 2021/0005135 A1* | 1/2021 | Kim | .................. | H10K 59/40 |
| 2021/0028241 A1* | 1/2021 | Kim | .................. | H01L 27/124 |
| 2021/0091162 A1* | 3/2021 | Kim | .................. | G02F 1/13452 |
| 2021/0098506 A1* | 4/2021 | Tsai | .................. | H10K 77/111 |
| 2021/0257389 A1* | 8/2021 | Zhang | ................ | H01L 27/1259 |

(Continued)

FOREIGN PATENT DOCUMENTS

KR 10-2021-0086900 A 7/2021

*Primary Examiner* — Joseph C. Nicely
*Assistant Examiner* — E. Rhett Cheek
(74) *Attorney, Agent, or Firm* — Fish & Richardson P.C.

(57) ABSTRACT

A display panel includes an active area in which a plurality of pixels is disposed; and a non-active area including a plurality of pads connected to the active area, the plurality of pads includes a first pad and a second pad which are spaced apart from each other with a first distance therebetween in a first direction and a third pad which is spaced apart from the first pad or the second pad with a second distance therebetween in a second direction, a link line connected to the third pad is disposed between the first pad and the second pad, and a metal layer may be disposed on the link line.

15 Claims, 10 Drawing Sheets

(56) References Cited

U.S. PATENT DOCUMENTS

| | | | | |
|---|---|---|---|---|
| 2021/0328107 A1* | 10/2021 | An | .......................... | H10K 59/12 |
| 2022/0085261 A1* | 3/2022 | Min | ...................... | H01L 27/156 |
| 2022/0254285 A1* | 8/2022 | Wang | ..................... | G09G 3/006 |
| 2024/0251618 A1* | 7/2024 | Murakami | ........... | H10K 59/131 |

* cited by examiner

DISPLAY PANEL AND DISPLAY DEVICE INCLUDING THE SAME

CROSS-REFERENCE TO RELATED APPLICATION

This application claims the priority of Korean Patent Application No. 10-2021-0188472 filed on Dec. 27, 2021, which is hereby incorporated by reference in its entirety.

BACKGROUND

Field of the Disclosure

The present disclosure relates to a display panel which can minimize a defect related to a pad located in a non-active area of a display panel and a display device including the same.

Description of the Background

As display devices which are used for a monitor of a computer, a television, a cellular phone, or the like, there are an organic light emitting display device (OLED) which is a self-emitting device, a liquid crystal display device (LCD) which requires a separate light source, and the like.

An applicable range of the display device is diversified to personal digital assistants as well as monitors of computers and televisions and a display device with a large display area and a reduced volume and weight is being studied.

Recently, a flexible display device which is manufactured by forming a display element and a wiring line on a flexible substrate such as plastic which is a flexible material so as to be capable of displaying images even though the display device is bent like a paper is getting attention as a next generation display device.

SUMMARY

Accordingly, the present disclosure is to provide a display panel which minimizes a defect which may be generated in a link line, by disposing a metal layer on the link line disposed between at least two pads and a display device including the same.

The present disclosure is not limited to the above-mentioned features and other features not mentioned above, can be clearly understood by those skilled in the art from the following descriptions.

According to an aspect of the present disclosure, a display panel includes: an active area in which a plurality of pixels is disposed; and a non-active area including a plurality of pads connected to the active area, the plurality of pads includes a first pad and a second pad which are spaced apart from each other with a first distance therebetween in a first direction and a third pad which is spaced apart from the first pad or the second pad with a second distance therebetween in a second direction, a link line connected to the third pad is disposed between the first pad and the second pad, and a metal layer may be disposed on the link line.

According to another aspect of the present disclosure, a display device includes a display panel including an active area in which a plurality of pixel is disposed and a non-active area including a plurality of pads connected to the active area; and a driving circuit disposed on the plurality of pads, the plurality of pads includes a first pad and a second pad which are spaced apart from each other with a first distance therebetween in a first direction and a third pad which is spaced apart from the first pad or the second pad with a second distance therebetween in a second direction, a link line connected to the third pad is disposed between the first pad and the second pad, and a metal layer may be disposed on the link line.

Other detailed matters of the exemplary aspects are included in the detailed description and the drawings.

According to the display panel and the display device according to the present disclosure, a defect which may be generated in a link line may be minimized by disposing a metal layer on the link line disposed between at least two pads.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, exemplary aspects of the present disclosure will be described with reference to the drawings.

Figure 1:
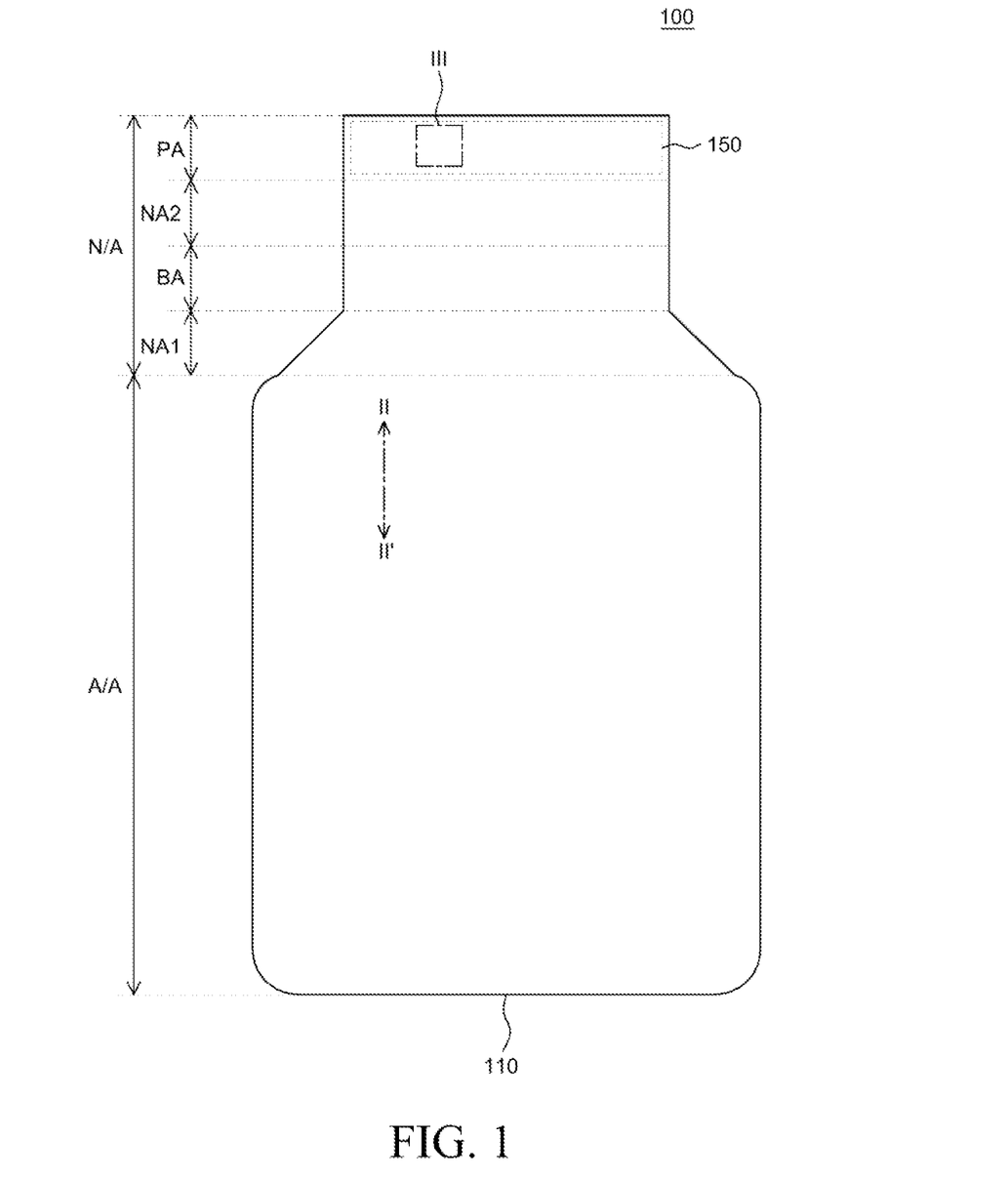
FIG. 1 is a conceptual view illustrating a plan view of a display device (or display apparatus) according to an exemplary aspect of the present disclosure.

FIG. 1 is a conceptual view illustrating a plan view of a display device according to an exemplary aspect of the present disclosure.

The substrate 110 is a substrate to which a ductility is given and supports various components of the display device 100. The substrate 110 may be formed of a material having flexibility and for example, may be formed of a plastic material, such as polyimide (PI).

Referring to FIG. 1, the substrate 110 includes an active area A/A and a non-active area N/A.

The active area A/A is an area where a plurality of pixels is disposed to display images. In the active area A/A, a display unit for displaying images and a circuit unit for driving the display unit may be disposed. For example, when the display device 100 is an organic light emitting display device, the display unit may include an organic light emitting diode. That is, the display unit includes an anode, an organic layer on the anode, and a cathode on the organic layer. For example, the organic layer may be configured by a hole transport layer, a hole injection layer, an organic emission layer, an electron injection layer, and an electron transport layer. However, when the display device 100 is a liquid crystal display device, the display unit may be configured to include a liquid crystal layer. Hereinafter, for the convenience of description, it is assumed that the display device 100 is an organic light emitting display device, but is not limited thereto. The circuit unit may include various thin film transistors, capacitors, and wiring lines for driving the organic light emitting diode. For example, the circuit unit may include various components such as a driving thin film transistor, a switching thin film transistor, a storage capacitor, a gate line, and a data line, but is not limited thereto.

Referring to FIG. 1, the active area A/A may have a rounded corner. Recently, as the design aspect is emphasized, there is a need for an active area A/A having a shape other than a rectangular active area A/A of the related art. Correspondingly, the substrate 110 of the display device 100 according to the exemplary aspect of the present disclosure has a rounded corner. However, the shape of the active area A/A is not limited thereto and may have different shapes such as a rectangular shape according to an exemplary aspect.

In the non-active area N/A, an image is not displayed and various wiring lines, circuits, and the like for driving a display unit of the active area A/A, such as a link line, are disposed. Further, in the non-active area N/A, various ICs such as a gate driver IC and a data driver IC and driving circuits may be disposed.

The non-active area N/A may be defined as an area extending from the active area A/A as illustrated in FIG. 1. However, it is not limited thereto and the non-active area N/A may be defined to include an area which encloses the active area A/A. Further, the non-active area N/A may be defined to extend from a plurality of sides of the active area A/A.

Referring to FIG. 1, the non-active area N/A includes a first non-active area NA1, a bending area BA, a second non-active area NA2, and a pad area PA. The first non-active area NA1 is an area extending from the active area A/A and the bending area BA is an area which extends from the first non-active area NA1 and is bendable. The second non-active area NA2 is an area extending from the bending area BA and the pad area PA extends from the second non-active area NA2. In the pad area PA, a plurality of pads may be disposed.

A driving circuit (or a driving integrated circuit (IC) 150) may be bonded to the plurality of pads. The driving circuit 150 may be bonded to the plurality of pads by a chip on plastic (COP) manner. For example, the driving circuit 150 may be bonded to the plurality of pads by means of an anisotropic conductive film. Therefore, the driving circuit 150 is electrically connected to the plurality of pads to transmit an electric signal to the active area A/A.

Figure 2:
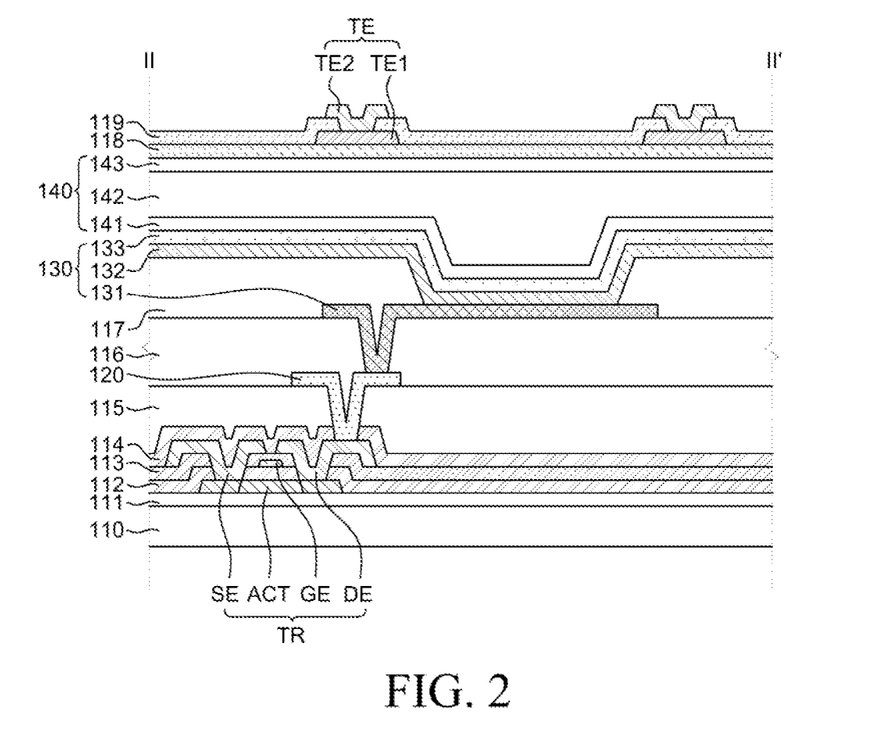
FIG. 2 is a cross-sectional view taken along line II-II' of FIG. 1.

FIG. 2 is a view for explaining a cross section taken along the line II-II' of FIG. 1.

Referring to FIG. 2, in the active area A/A of the display device 100 according to the exemplary aspect of the present disclosure, a substrate 110, a buffer layer 111, a transistor TR, a gate insulating layer 112, an interlayer insulating layer 113, a passivation layer 114, a first planarizing layer 115, a second planarizing layer 116, a connection electrode 120, a bank 117, a light emitting diode 130, an encapsulating unit 140, and a touch sensing unit TE may be disposed.

The buffer layer 111 may be disposed on the substrate 110. The buffer layer 111 may improve adhesiveness between layers formed on the buffer layer 111 and the substrate 110 and serve to block alkali components from leaking through the substrate 110. The buffer layer 111 is not an essential component and may be omitted based on a type or a material of the substrate 110 and a structure and a type of the transistor TR.

The transistor TR may be disposed on the buffer layer 111. The transistor TR includes an active layer ACT, a gate electrode GE, a source electrode SE, and a drain electrode DE. Here, depending on the design of the pixel circuit, the source electrode SE may serve as a drain electrode DE and the drain electrode DE may serve as a source electrode SE. In the active area A/A of the substrate 110, the active layer ACT of the transistor TR may be disposed on the buffer layer 111.

The active layer ACT may include a channel region in which a channel is formed when the transistor TR is driven and a source region and a drain region on both sides of the channel region. The source region may refer to a portion of the active layer ACT which is connected to the source electrode SE and the drain region may refer to a portion of the active layer ACT which is connected to the drain electrode DE.

For example, the active layer ACT may be formed of various metal oxides such as indium-gallium-zinc-oxide (IGZO). Among various metal oxides that may be used to form the active layer ACT, it has been described that the active layer is formed based on an IGZO layer, but it is not limited thereto. Therefore, the active layer may be formed of another metal oxide such as indium-zinc-oxide (IZO), indium-gallium-tin-oxide (IGTO), or indium-gallium-oxide (IGO), other than IGZO. The active layer ACT may be formed by depositing the metal oxide on the buffer layer 111, performing a heat treatment for stabilization, and then patterning the metal oxide.

The gate insulating layer 112 may be disposed on the active layer ACT of the transistor TR. The gate insulating layer 112 may be formed as a single layer of silicon nitride SiNx or silicon oxide SiOx or a multilayer thereof. In the gate insulating layer 112, contact holes through which the source electrode SE and the drain electrode DE of the transistor TR are connected to the source region and the drain region of the active layer ACT of the transistor TR may be formed.

The gate electrode GE of the transistor TR may be disposed on the gate insulating layer 112. The gate electrode GE may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The gate electrode GE may be formed on the gate insulating layer 112 so as to overlap the channel region of the active layer ACT of the transistor TR.

The interlayer insulating layer 113 may be disposed on the gate insulating layer 112 and the gate electrode GE. The interlayer insulating layer 113 may be configured by a single layer of silicon nitride SiNx or silicon oxide SiOx or a multi-layer thereof. Contact holes through which the source region and the drain region of the active layer ACT of the transistor TR are exposed may be formed in the interlayer insulating layer 113.

The source electrode SE and the drain electrode DE of the transistor TR may be disposed on the interlayer insulating layer 113. The source electrode SE and the drain electrode DE of the transistor TR may be connected to the active layer ACT of the transistor TR through the contact holes formed in the gate insulating layer 112 and the interlayer insulating layer 113. Therefore, the source electrode SE of the transistor TR may be connected to the source region of the active layer ACT through the contact holes formed in the gate insulating layer 112 and the interlayer insulating layer 113. Further, the drain electrode DE of the transistor TR may be connected to the drain region of the active layer ACT through the contact holes formed in the gate insulating layer 112 and the interlayer insulating layer 113.

The passivation layer 114 may be disposed on the source electrode SE and the drain electrode DE of the transistor TR. That is, the passivation layer 114 may be disposed so as to cover a plurality of transistors TR. The passivation layer 114 may be configured by a single layer of silicon nitride SiNx or silicon oxide SiOx or a multi-layer thereof. In the passivation layer 114, a contact hole which exposes the source electrode SE and/or the drain electrode DE of the transistor TR may be formed.

The first planarizing layer 115 may be disposed on the passivation layer 114. A contact hole which exposes the drain electrode DE may be formed in the first planarizing layer 115. The first planarizing layer 115 may be an organic material layer which planarizes and protects an upper portion of the transistor TR. For example, the first planarizing layer 115 may be formed of an organic material such as acryl resin, epoxy resin, phenolic resin, polyamide resin, or polyimide resin.

The connection electrode 120 may be disposed on the first planarizing layer 115. The connection electrode 120 may be connected to the drain electrode DE of the transistor TR through the contact holes of the first planarizing layer 115. The connection electrode 120 may serve to electrically connect the transistor TR and the first electrode 131. The connection electrode 120 may be formed of a single layer or a multi-layer formed of any one of molybdenum (Mo), copper (Cu), titanium (Ti), aluminum (Al), chrome (Cr), gold (Au), nickel (Ni), and neodymium (Nd) or an alloy thereof. The connection electrode 120 may be formed of the same material as the source electrode SE and the drain electrode DE of the transistor TR.

Even though it is not illustrated in the drawing, an additional signal line may be disposed on the first planarizing layer 115. At this time, the signal line may be formed of the same material by the same process as the connection electrode 120, but is not limited thereto.

The second planarizing layer 116 may be disposed on the first planarizing layer 115 and the connection electrode 120. A contact hole which exposes the connection electrode 120 may be formed in the second planarizing layer 116. The second planarizing layer 116 may be an organic material layer which planarizes an upper portion of the transistor TR. For example, the second planarizing layer 116 may be formed of an organic material such as acryl resin, epoxy resin, phenolic resin, polyamide resin, or polyimide resin.

The light emitting diode 130 is disposed on the second planarizing layer 116. The light emitting diode 130 may include a first electrode 131, an emission structure 132, and a second electrode 133.

The first electrode 131 may be disposed on the second planarizing layer 116. The first electrode 131 may be electrically connected to the connection electrode 120 through the contact hole formed in the second planarizing layer 116. Therefore, the first electrode 131 is electrically connected to the connection electrode 120 through the contact hole formed in the second planarizing layer 116 to be electrically connected to the transistor TR.

Since the display device 100 according to the exemplary aspect of the present disclosure is a top emission display device, the first electrode 131 may be an anode electrode. When the display device 100 is a bottom emission type, the first electrode 131 disposed on the second planarizing layer 116 may be a cathode electrode.

The bank 117 may be disposed on the first electrode 131 and the second planarizing layer 116. An opening may be formed in the bank 117 to expose the first electrode 131. Since the bank 117 defines an emission area of the display device 100, the bank 117 may also be referred to as a pixel definition layer. A spacer may be further disposed on the bank 117.

Further, the emission structure 132 including an emission layer may be further disposed on the first electrode 131. The emission structure 132 may be formed such that a hole layer, an emission layer, and an electron layer are laminated on the first electrode 131 in this order or a reverse order. Further, the emission structure 132 may include first and second emission structures which are opposite to each other and a charge generating layer therebetween. In this case, any one emission layer of the first and second emission structures generates blue light and the other one emission layer of the first and second emission structures generates yellow-green light so that white light may be generated by the first and the second emission structures. The white light generated in the emission structure 132 is incident onto a color filter disposed above the emission structure 132 to implement color images. In addition, individual emission structures 132 generate color light corresponding to individual sub pixels without having separate color filters to implement color images. That is, the emission structure 132 of a red sub pixel may generate red light, the emission structure 132 of a green sub pixel may generate green light, and the emission structure 132 of a blue sub pixel may generate blue light.

The second electrode 133 may be further disposed on the emission structure 132. The second electrode 133 may be disposed on the emission structure 132 so as to be opposite to the first electrode 131 with the emission structure 132 therebetween. In the display device 100 according to the exemplary aspect of the present disclosure, the second electrode 133 may be a cathode electrode.

The encapsulating unit 140 may be disposed on the light emitting diode 130. For example, the encapsulating unit 140 may be further disposed on the second electrode 133 to suppress moisture permeation.

The encapsulating unit 140 may include a first inorganic encapsulating layer 141, an organic encapsulating layer 142, and a second inorganic encapsulating layer 143. The first inorganic encapsulating layer 141 of the encapsulating unit 140 may be disposed on the second electrode 133. The organic encapsulating layer 142 may be disposed on the first inorganic encapsulating layer 141. Further, the second inorganic encapsulating layer 143 may be disposed on the organic encapsulating layer 142. The first inorganic encapsulating layer 141 and the second inorganic encapsulating layer 143 of the encapsulating unit 140 may be formed of an inorganic material such as silicon nitride SiNx or silicon oxide SiOx. The organic encapsulating layer 142 of the encapsulating unit 140 may be formed of an organic material such as acryl resin, epoxy resin, phenolic resin, polyamide resin, or polyimide resin.

A first touch interlayer insulating layer 118 may be disposed on the second inorganic encapsulating layer 143 of the encapsulating unit 140. The first touch interlayer insulating layer 118 may be formed of an inorganic material such as silicon nitride SiNx or silicon oxide SiOx.

A plurality of touch sensing units TE including a plurality of bridge electrodes TE1 and a plurality of touch electrodes TE2 may be disposed on the first touch interlayer insulating layer 118.

For example, the plurality of bridge electrodes TE1 is disposed on the first touch interlayer insulating layers 118 and the second touch interlayer insulating layer 119 may be disposed on the plurality of bridge electrodes TE1. The plurality of touch electrodes TE2 may be disposed on the second touch interlayer insulating layer 119. The plurality of touch electrodes TE2 may be in contact with the plurality of bridge electrodes TE1 by means of the hole provided in the second touch interlayer insulating layer 119. In the meantime, the plurality of touch electrodes TE2 may be an electrode formed of a transparent metal or an electrode formed of an opaque metal. The second touch interlayer insulating layer 119 may be formed of an inorganic material such as silicon nitride SiNx or silicon oxide SiOx.

Figure 3:
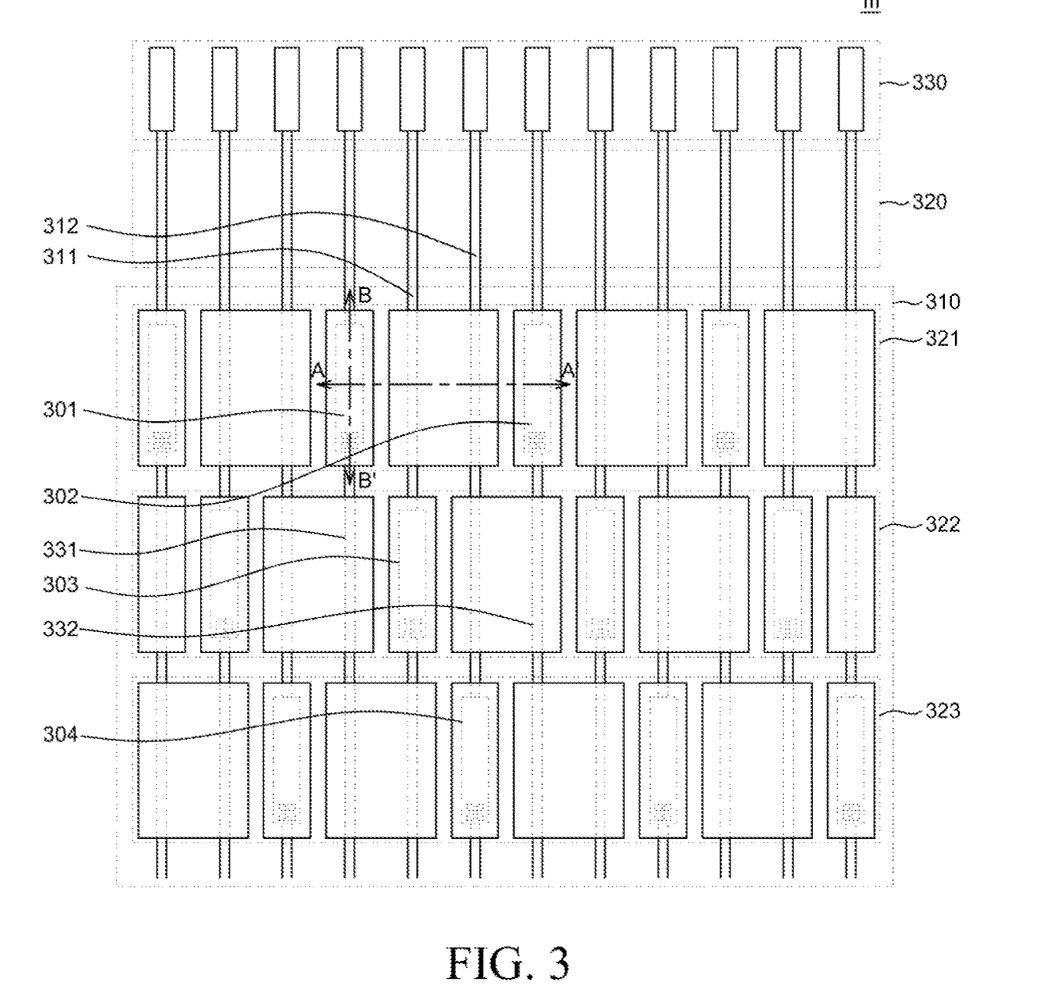
FIG. 3 is a view for explaining an example of region III of FIG. 1.

FIG. 3 is a view for explaining an example of a region III of FIG. 1.

Referring to FIG. 3, the pad area PA may include a first region 310 in which a plurality of pads (for example, a first pad 301 and a second pad 302) and at least a part of a link line (for example, a first link line 311 and a second link line 312) are disposed, a second region 320 in which the link line is disposed, and a third region 330 which includes a test pad for testing the operation of the display panel.

The link line may be a wiring line extending from the active area of the display panel. The pad may be a component which is disposed in at least a part of the link line to be connected to another structure disposed on the pad, for example, a driving circuit (for example, the driving circuit 150 of FIG. 1). The test pad may be a component which is connected to the link line and the test unit. Here, the test unit may be a component which performs various tests related to the operation of the display device and with regard to this, various known test units may be used.

In the exemplary aspect, the plurality of pads may be disposed to have a plurality of columns. For example, as illustrated in the drawing, the plurality of pads may be disposed to form a first column 321, a second column 322, and a third column 323. Pads disposed in a same column may be spaced with a predetermined distance with a link line connected to a pad disposed in the other column therebetween. For example, the first pad 301 and the second pad 302 disposed in the first column 321 may be spaced apart from each other with the first link line 311 and the second link line 312 therebetween. The first link line 311 may be connected to a third pad 303 disposed in the second column 322. The second link line 312 may be connected to a fourth pad 304 disposed in the third column 323.

In the exemplary aspect, a link line 331 connected to the first pad 301 is disposed at one side of the third pad 303 and a link line 332 connected to the second pad 302 may be disposed at the other side of the third pad 303.

Even though in FIG. 3, it is illustrated that the plurality of pads is disposed in three columns, the exemplary aspect is not limited thereto, and the plurality of pads may be disposed in two columns or disposed in four or more columns. If the plurality of pads is disposed in two columns, one link line may be disposed between the first pad 301 and the second pad 302. If the plurality of pads is disposed in four or more columns, three or more link lines may be disposed between the first pad 301 and the second pad 302. Also, in this case, the exemplary aspect of the present disclosure is not limited thereto and various examples related to the link line to be described below may be applied.

The second region 320 may include at least a part of each of the link lines connected to each of the plurality of pads disposed in the first region 310. Depending on the exemplary aspect, various circuits for implementing a specific function of the display device may be added in the second region 320. The additional circuit may implement the function by being connected to the link line of the second region 320 to transmit various signals to the display panel.

The third region 330 may include the test pad. The test pads may be connected to the link lines connected to each of the plurality of pads.

Even though it is not illustrated, the driving circuit (for example, the driving circuit 150 of FIG. 1) may be disposed on the first region 310, the second region 320, and the third region 330 illustrated in FIG. 3. The driving circuit may be electrically connected to the pad and the link line. The driving circuit may supply a signal to the link line to control the operation of the display panel.

Figure 4:
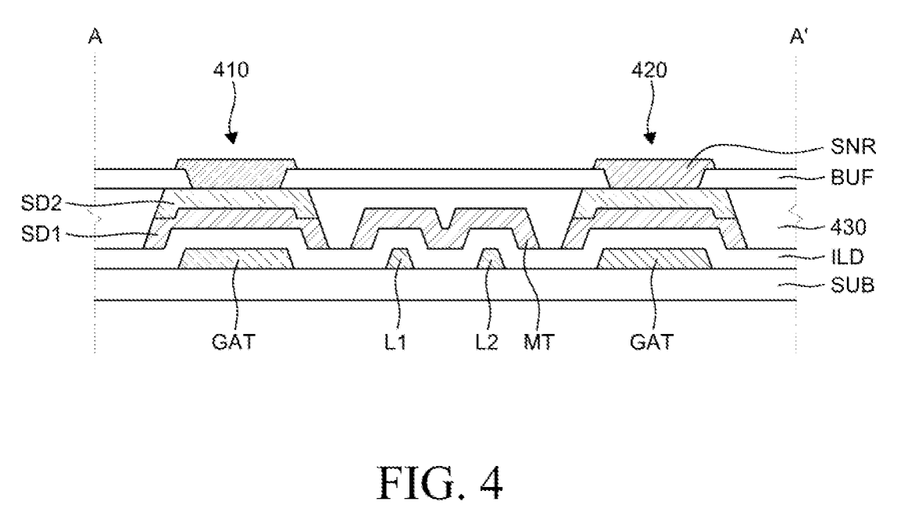
FIG. 4 is a view for explaining an example of a cross-section taken along A-A' of FIG. 3.

FIG. 4 is a view for explaining an example of a cross section taken along A-A' of FIG. 3.

Referring to FIG. 4, a first link line L1 and a second link line L2 may be disposed between a first pad 410 and a second pad 420. A configuration of the first pad 410 may correspond to a configuration of the second pad 420 so that the configuration will be described with respect to the first pad 410 and the description of the second pad 420 will be omitted.

In the exemplary aspect, the first pad 410 may include at least one of a substrate SUB, a gate metal layer GAT, an insulating layer ILD, a first metal layer SD1, a second metal layer SD2, a sensor metal layer SNR, and a buffer layer BUF. Depending on the exemplary aspect, at least some of the configurations included in the first pad 410 will be omitted or another configuration may be added.

To be more specific, as the configuration of the first pad 410, the gate metal layer GAT may be disposed on the substrate SUB. The substrate SUB may correspond to the substrate 110 of FIG. 1. For example, the substrate SUB may be a part of the substrate 110 of FIG. 1 which is disposed in the pad area PA. The gate metal layer GAT may be configured by the same material (for example, molybdenum (Mo)) as the gate electrode, the source electrode, or the drain electrode of the transistor disposed in the active area A/A. Further, the first link line L1 and the second link line L2 to be described below may be configured by the same material (for example, molybdenum (Mo)) as the gate electrode of the transistor. In this case, the gate metal layer GAT, the first link line L1, and the second link line L2 may be disposed on the same plane as the gate electrode, the source electrode, or the drain electrode of the transistor.

The insulating layer ILD may be disposed on the gate metal layer GAT. In this case, an exposed portion of the gate metal layer GAT may be covered by the insulating layer ILD. The insulating layer ILD extends to the first link line L1 and the second link line L2 to be disposed on the first link line L1 and the second link line L2. In this case, the first link line L1 and the second link line L2 may also be covered by the insulating layer ILD.

The insulating layer ILD may correspond to the interlayer insulating layer 113 formed in the active area. For example, the insulating layer ILD may be configured by the same material as the interlayer insulating layer 113 of the active area and formed by the same process as the interlayer insulating layer 113.

The first metal layer SD1 and the second metal layer SD2 may be sequentially laminated on the insulating layer ILD. The first metal layer SD1 and the second metal layer SD2 may correspond to the source electrode and/or the drain electrode of the transistor. For example, the first metal layer SD1 and the second metal layer SD2 may be configured by the same material (for example, aluminum (Al)) as the source electrode and/or the drain electrode of the transistor. For example, the first metal layer SD1 may be configured by the same material as the source electrode and the second metal layer SD2 may be configured by the same material as the drain electrode. However, it is not limited thereto and depending on the exemplary aspect, the first metal layer SD1 and the second metal layer SD2 may be implemented to perform a role other than the source electrode or the drain electrode.

In FIG. 4, an example in which a plurality of metal layers, that is, the first metal layer SD1 and the second metal layer SD2 are disposed on the insulating layer ILD. However, the exemplary aspect is not limited thereto and only one of the first metal layer SD1 and the second metal layer SD2 may be disposed or an additional metal layer may be further disposed.

An organic layer 430 may be disposed in the vicinity of the first metal layer SD1 and the second metal layer SD2. The organic layer 430 may include photoacryl. In some cases, an inorganic layer may be disposed in the vicinity of the first metal layer SD1 and the second metal layer SD2. In this case, the inorganic layer may include SiNx.

The sensor metal layer SNR and the buffer layer BUF may be disposed on the second metal layer SD2.

Depending on the exemplary aspect, the buffer layer BUF may further include a passivation layer. In this case, the passivation layer and the buffer layer may be sequentially laminated on the second metal layer SD2.

The sensor metal layer SNR may be disposed on the same plane layer as the buffer layer BUF. The sensor metal layer SNR may be formed of the same material as at least a part (for example, the touch electrode TE2 and the bridge electrode TE1) of the touch sensing unit TE of the active area. In this case, the sensor metal layer SNR may be formed by the same process as at least a part of the touch sensing unit TE. For example, the sensor metal layer SNR may be formed of an opaque metal, but is not limited thereto.

The metal layer MT may be disposed on the link line. Specifically, referring to FIG. 4, the insulating layer ILD may be disposed on the first link line L1 and the second link line L2 and the metal layer MT may be disposed on the insulating layer ILD. The metal layer MT may correspond to the first metal layer SD1 of the pad. For example, the metal layer MT may be configured by the same material as the first metal layer SD1. The metal layer MT may be formed by the same process as the first metal layer SD1. In some cases, the metal layer MT may be changed to a material other than the first metal layer SD1, and a related example may be described with reference to FIG. 5.

In an exemplary aspect, the metal layer MT may be formed to cover the first link line L1 and the second link line L2 at one time, with a constant thickness. However, the exemplary aspect is not limited thereto and if necessary, the metal layer MT may be formed to individually cover the first link line L1 and the second link line L2. In this case, an interval may be formed between a metal layer MT disposed on the first link line L1 and a metal layer MT disposed on the second link line L2. A more specific example related thereto will be described with reference to FIG. 6.

Figure 5:
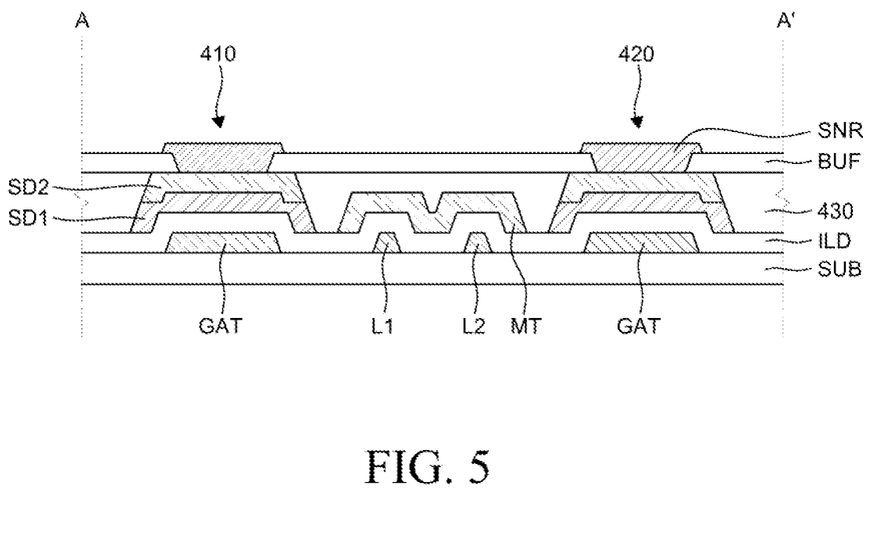
FIG. 5 is a view for explaining another example of a cross-section taken along A-A' of FIG. 3.

FIG. 5 is a view for explaining another example of a cross section taken along A-A' of FIG. 3. Hereinafter, with regard to the description of FIG. 5, repeated contents with FIG. 4 will be omitted.

Referring to FIG. 5, the metal layer MT disposed on the first link line L1 and the second link line L2 may correspond to the second metal layer SD2 of the pad. However, it is limited thereto and the metal layer MT may include another metal material which is distinguished from the first metal layer SD1 of FIG. 4 or the second metal layer SD2 of FIG. 5.

Figure 6:
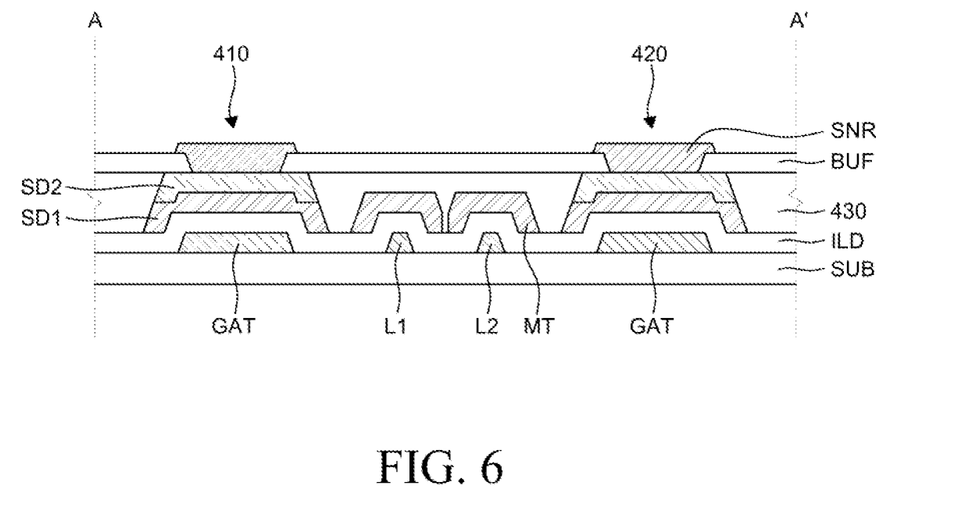
FIG. 6 is a view for explaining still another example of a cross section taken along A-A' of FIG. 3.

FIG. 6 is a view for explaining still another example of a cross section taken along A-A' of FIG. 3. Hereinafter, with regard to the description of FIG. 6, repeated contents with FIG. 4 will be omitted.

Referring to FIG. 6, the metal layer MT may be disposed on the first link line L1 and the second link line L2, separately. The metal layer MT disposed on the first link line L1 and the metal layer MT disposed on the second link line L2 may be distinguished from each other.

In the exemplary aspect, a distance between the metal layer MT disposed on the first link line L1 and the metal layer MT disposed on the second link line L2 may be determined in advance.

In FIG. 6, in order to enclose the link line, the metal layers MT are laminated with a trapezoidal shape corresponding to an external shape of the cross section of the link line, but is not limited thereto. For example, the metal layers MT may be laminated with a quadrangular shape or an oval shape.

Figure 7:
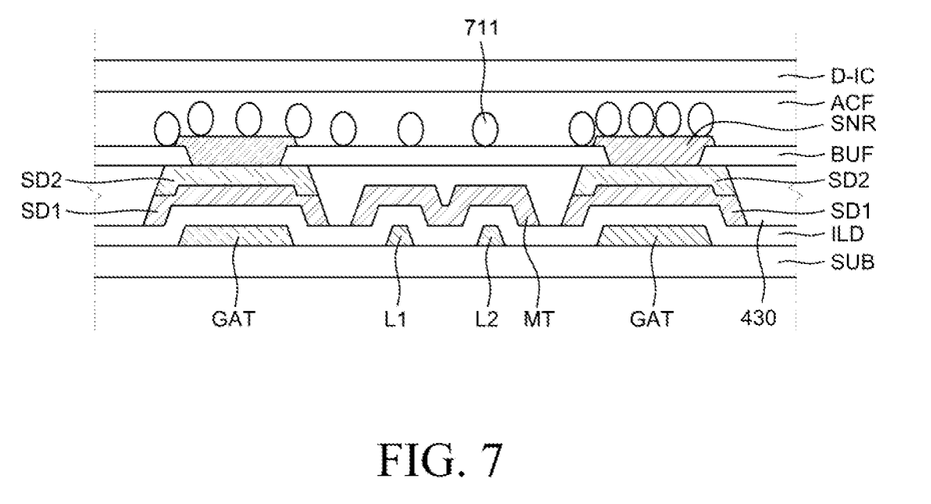
FIG. 7 is a view for explaining a cross-section when a driving circuit is connected to a display panel in a display device according to an exemplary aspect of the present disclosure.

FIG. 7 is a view for explaining a cross section when a driving circuit is connected to a display panel in a display device according to an exemplary aspect of the present disclosure.

Referring to FIG. 7, an adhesive layer ACF may be disposed on the buffer layer BUF and the sensor metal layer SNR. The adhesive layer ACF is a component having adhesiveness and for example, may include an anisotropic conductive film. The anisotropic conductive film may be a thin film having a resin component including conductive balls 711 to have electrical conduction (conductivity) in a vertical direction and adhesiveness. The anisotropic conductive film has conductive particles dispersed therein to allow current to pass through and maintains the adhesiveness by the resin which is hardened by heat and pressure.

Referring to FIG. 7, a driving circuit D-IC disposed on the adhesive layer ACF may be electrically connected to the sensor metal layer SNR disposed below the adhesive layer ACF by means of the conductive balls 711 of the adhesive layer ACF. In this case, the signal generated in the driving circuit D-IC may be transmitted to the display panel via the sensor metal layer SNR, the second metal layer SD2, the first metal layer SD1, and the gate metal layer GAT.

Figure 8:
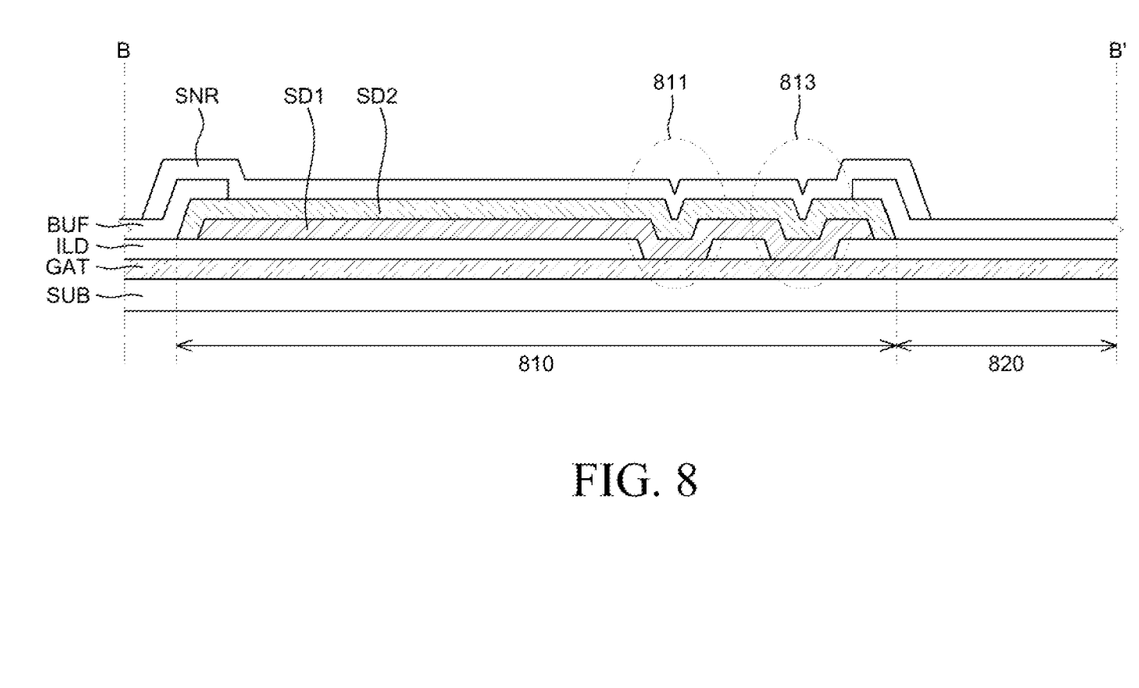
FIG. 8 is a view for explaining an example of a cross-section taken along B-B' of FIG. 3.

FIG. 8 is a view for explaining an example of a cross section taken along B-B' of FIG. 3. Specifically, FIG. 8 is a view for explaining a cross section perpendicular to a cross section of the pad area explained in FIG. 4.

Referring to FIG. 8, a first region 810 may correspond to a region where the pad (for example, the first pad 301 of FIG. 3) is disposed. The second region 820 may correspond to a link line (for example, a link line connected to the first pad 301 of FIG. 3).

In the insulating layer ILD of the pad, contacts holes 811 and 813 which expose a link line LL may be formed. The first metal layer SD1 and the second metal layer SD2 may be connected to the link line LL by the contact holes formed in the interlayer insulating layer 113.

Referring to FIG. 8, the gate metal layer GAT of the pad and the link line may be integrally formed. For example, a part of the metal layer configured by the same material as the gate electrode of the transistor disposed in the active area may correspond to the gate metal layer GAT of the pad and the other part may correspond to the link line.

According to the exemplary aspect, the insulating layer ILD of the pad and the insulating layer disposed on the link line may be integrally formed. For example, a part of an insulting layer which is configured by a specific material may correspond to the insulating layer ILD of the pad and the other part may correspond to the insulating layer disposed on the link line.

According to the exemplary aspect, the buffer layer BUF of the pad and a buffer layer disposed on the link line may be integrally formed. For example, a part of a buffer layer which is configured by a specific material may correspond to the buffer layer BUF of the pad and the other part may correspond to the buffer layer disposed on the link line.

Figure 9:
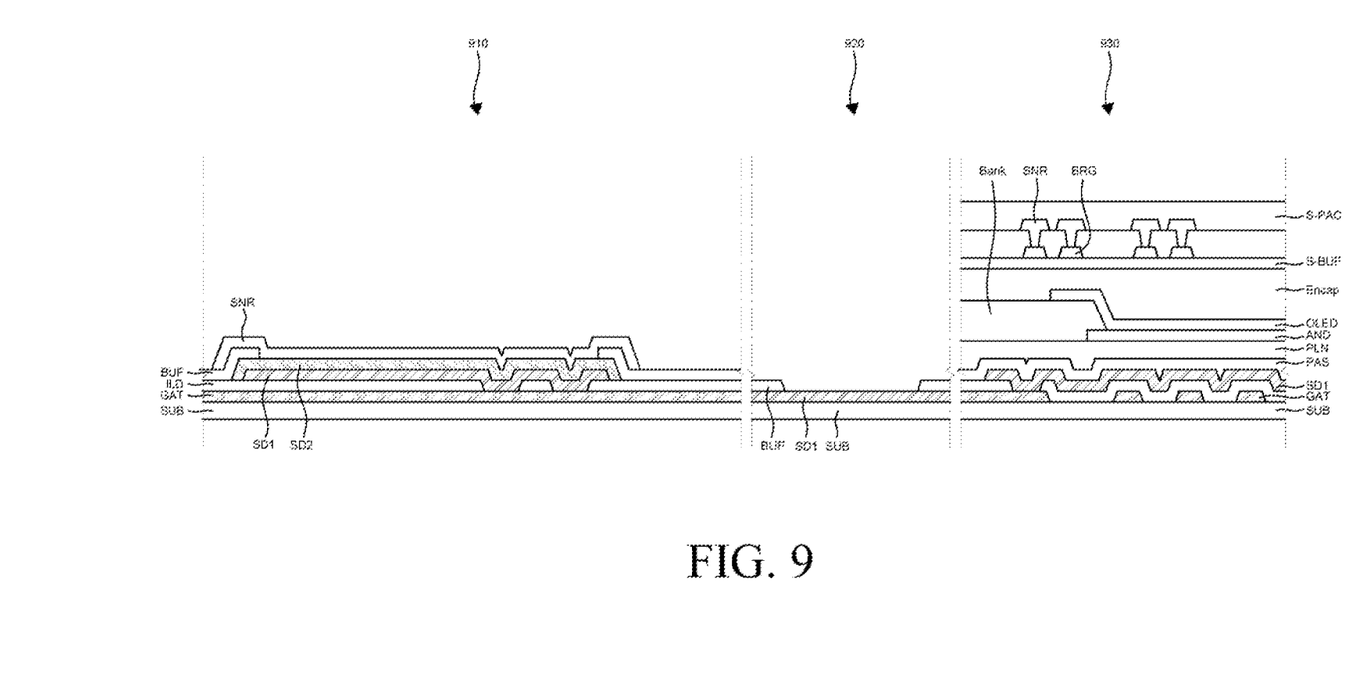
FIG. 9 is a view for explaining a cross-section of an active area and a non-active area according to an exemplary aspect of the present disclosure.

FIG. 9 is a view for explaining a cross section of an active area and a non-active area according to an exemplary aspect of the present disclosure.

The reference numeral 910 of FIG. 8 may correspond to FIG. 8. That is, the reference numeral 910 denotes a cross section of at least a part of a pad area (for example, the pad area PA of FIG. 1). The reference numeral 910 may be a cross section indicating at least a part of the pad area in a first direction of the display panel. In this case, the reference numerals 920 and 930 to be described below may be a cross section of at least a part of the display panel in the first direction. Here, the first direction may correspond to a direction in which the link line extends.

The reference numeral 920 denotes a cross section of at least a part of a bending area (for example, the bending area BA of FIG. 1). Referring to the reference numeral 920, in the bending area, the first metal layer SD1 of the pad area extends to be disposed on the substrate SUB. The first metal layer SD1 extends to the active area to be disposed on the gate metal layer GAT in the active area as denoted by the reference numeral 930. The first metal layer SD1 disposed in the bending area is connected to the link line to transmit a signal transmitted through the link line to one component of the active area connected to the first metal layer SD1. The buffer layer BUF may be disposed on the first metal layer SD1.

Depending on the exemplary aspect, the first metal layer SD1 of the bending area may be referred to as various terms, and the exemplary aspect is not limited to the term.

Even though it is not illustrated in the drawing, an additional layer may be disposed on the buffer layer BUF and/or the sensor metal layer SNR denoted by the reference numerals 910 and 920.

The reference numeral 930 denotes a cross section of at least a part of an active area (for example, the active area A/A of FIG. 1). Referring to the reference numeral 930, a gate metal layer GAT corresponding to the gate electrode is disposed on the substrate SUB (for example, the substrate 110 of FIG. 1). An insulating layer ILD, source and/or drain electrodes (SD), a passivation layer PAS (for example, the passivation layer 114 of FIG. 1), and a planarizing layer PLN may be sequentially disposed on the gate metal layer GAT.

Here, the gate metal layer GAT, the source and/or drain electrodes SD may be included in the transistor. In this case, the passivation layer PAS and the planarizing layer PLN may be disposed on the transistor.

Light emitting diodes OLED and, a bank BANK (for example, the bank 117 of FIG. 1), an encapsulating layer Encap (for example, at least a part of the encapsulating unit 140 of FIG. 1) may be disposed on the planarizing layer PLN (the first planarizing layer 115 and/or the second planarizing layer 116 of FIG. 1). A sensor buffer layer S-BUF, touch sensing units SNR and BRG, and a sensor protecting layer S-PAC may be disposed on the encapsulating layer Encap.

The reference numeral 930 may denote a cross section in a direction perpendicular to the cross section illustrated in FIG. 2. For the convenience of description, in the reference numeral 930, some components of FIG. 2 may be omitted or added, but this is an exemplary aspect, so that the present disclosure is not limited thereto.

As illustrated in the drawing, the substrates SUB in the reference numerals 910, 920, and 930 may be disposed on the same plane, respectively. Further, the gate metal layer GAT in the reference numeral 930 may be disposed on the same plane as the gate metal layer GAT in the reference numeral 910.

In the exemplary aspect, the element configured of the same material may be formed by the same process. For example, the first metal layer SD1 of the reference numeral 910, the first metal layer SD1 of the reference numeral 920, and the source and/or drain electrodes SD of the reference numeral 930 may be formed by the same process.

Figure 10:
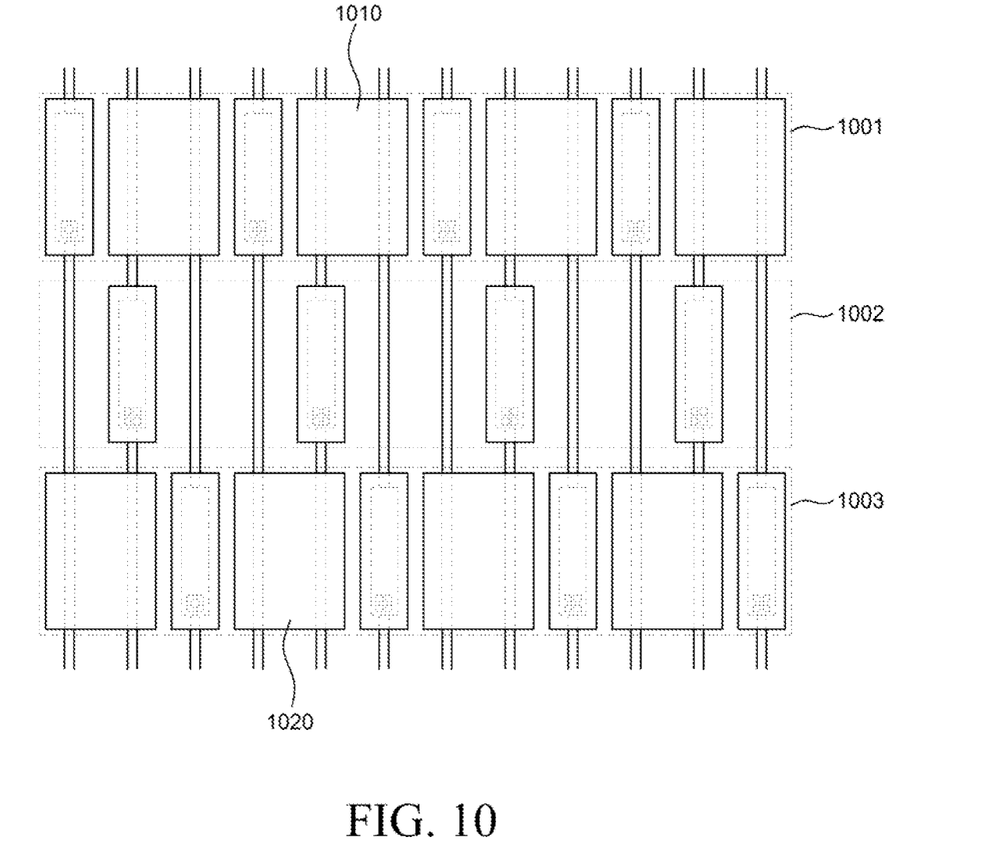
FIG. 10 is a view for explaining an example of a region where a pad is disposed in a display device according to an exemplary aspect of the present disclosure.

FIG. 10 is a view for explaining an example of a region where a pad is disposed in a display device according to an exemplary aspect of the present disclosure.

Referring to FIG. 10, a plurality of pads disposed in the pad area may be disposed to have three columns. Link lines are connected to the plurality of pads, respectively, and one pad may be connected to one link line.

As illustrated in the drawing, the plurality of pads may be disposed in the order of "first column-second column-third column-first column-second column-third column" so that adjacent pads may be disposed in different columns. As described above, an area in which the plurality of pads and link lines are disposed may be referred to as a pad area.

At least one link line may be disposed between adjacent pads in the same column. For example, as illustrated in the drawing, when the pads are disposed in three columns (a first column 1001, a second column 1002, and a third column 1003), two link lines may be disposed between two adjacent pads. Even though it is not illustrated, when the pads are disposed in four columns, three link lines may be disposed between two adjacent pads.

In the exemplary aspect, a metal layer (for example, a first metal layer 1010 and a second metal layer 1020) for protecting the link line may be disposed on the link line disposed between the adjacent pads of the first column 1001 and the third column 1003. The metal layer for protecting the link line may correspond to the metal layer MT of FIG. 4. In this case, the metal layer may be omitted on the link line disposed in the second column 1002.

According to the exemplary aspect, a driving circuit may be disposed on the pad area. When the driving circuit is disposed on the plurality of pads, a predetermined pressure may be applied to the pad area. In this case, a pressure may be applied to at least some of the plurality of pads and/or at least some of the link lines. According to an experimental result, a pressure applied to pads disposed in the first column and the third column, among the plurality of pads disposed in three columns, may be higher than a pressure applied to pads disposed in the second column.

A display panel and a display device according to the exemplary aspect of the present disclosure may include a metal layer (for example, the metal layer MT of FIG. 4) on the link line disposed between two adjacent pads disposed in the pad area. In this case, the crack of the link line (an inorganic layer on the link line) due to a pressure caused by disposing the driving circuit in the pad area may be suppressed.

Further, in some cases, the display panel and the display device according to the exemplary aspect of the present disclosure may dispose the metal layer in at least some having a pressure which is equal to or higher than a specific value, among the plurality of columns in which the plurality of pads is disposed. By doing this, the metal layer may be more effectively disposed.

The exemplary aspects of the present disclosure can also be described as follows:

According to an aspect of the present disclosure, a display panel includes: an active area in which a plurality of pixels is disposed; and a non-active area including a plurality of pads connected to the active area, the plurality of pads includes a first pad and a second pad which are spaced apart from each other with a first distance therebetween in a first direction and a third pad which is spaced apart from the first pad or the second pad with a second distance therebetween in a second direction, a link line connected to the third pad is disposed between the first pad and the second pad, and a metal layer may be disposed on the link line.

A link line connected to the first pad may disposed at one side of the third pad and a link line connected to the second pad may disposed at the other side of the third pad.

At least one of the first pad, the second pad, and the third pad may include a gate metal layer, an insulating layer, a first metal layer, a second metal layer, a sensor metal layer, and a buffer layer and a metal layer disposed on the link line corresponds to the first metal layer or the second metal layer.

The gate metal layer may correspond to the link line.

An insulating layer of the first pad and the second pad may extend to be disposed between the link line and the metal layer disposed on the link line.

At least one of the plurality of pixels may include a transistor including a gate electrode, a source electrode, and a drain electrode and a passivation layer disposed on the transistor.

The gate metal layer may correspond to the gate electrode, at least one of the first metal layer and the second metal layer may correspond to at least one of the source electrode and the drain electrode, and the buffer layer may correspond to the passivation layer.

A driving circuit may disposed on the plurality of pads.

According to another aspect of the present disclosure, a display device includes a display panel including an active area in which a plurality of pixel is disposed and a non-active area including a plurality of pads connected to the active area; and a driving circuit disposed on the plurality of pads, the plurality of pads includes a first pad and a second pad which are spaced apart from each other with a first distance therebetween in a first direction and a third pad which is spaced apart from the first pad or the second pad with a second distance therebetween in a second direction, a link line connected to the third pad is disposed between the first pad and the second pad, and a metal layer may be disposed on the link line.

A link line connected to the first pad may disposed at one side of the third pad and a link line connected to the second pad is disposed at the other side of the third pad.

At least one of the first pad, the second pad, and the third pad may include a gate metal layer, an insulating layer, a first metal layer, a second metal layer, a sensor metal layer, and a buffer layer and a metal layer disposed on the link line corresponds to the first metal layer or the second metal layer.

The gate metal layer may correspond to the link line.

An insulating layer of the first pad and the second pad may extend to be disposed between the link line and the metal layer disposed on the link line.

At least one of the plurality of pixels may include a transistor including a gate electrode, a source electrode, and a drain electrode and a passivation layer disposed on the transistor.

The gate metal layer may correspond to the gate electrode, at least one of the first metal layer and the second metal layer corresponds to at least one of the source electrode and the drain electrode, and the buffer layer corresponds to the passivation layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display panel, comprising:
   an active area in which a plurality of pixels is disposed;
   a non-active area including a plurality of pads connected to the active area,
   wherein the plurality of pads includes a first pad and a second pad which are separated from each other by a first distance in a first direction, a third pad which is separated from the first pad and the second pad by a second distance in a second direction, wherein the first pad and the second pad are disposed on a device region for an integrated circuit;
   a link line extending from a first end of the link line to a second end in the second direction, wherein the link line is disposed between the first pad and the second pad and connected to the third pad disposed in a test interface region, and wherein the first end of the link line is coupled to the third pad; and
   a metal layer disposed over the link line in the device region and between the first pad and the second pad,
   wherein at least one of the first pad, the second pad, and the third pad includes a gate metal layer, an insulating layer, a first metal layer, a second metal layer, a sensor metal layer, and a buffer layer, and
   wherein the metal layer disposed on the link line includes a same material as the first metal layer or the second metal layer.

2. The display panel of claim 1, wherein a link line connected to the first pad is disposed at one side of the third pad and a link line connected to the second pad is disposed at another side of the third pad.

3. The display panel of claim 1, wherein the gate metal layer corresponds to the link line.

4. The display panel of claim 1, wherein the insulating layer of the first pad and the second pad is extended between the link line and the metal layer disposed on the link line.

5. The display panel of claim 1, wherein at least one of the plurality of pixels includes:
   a transistor including a gate electrode, a source electrode, and a drain electrode; and
   a passivation layer disposed on the transistor.

6. The display panel of claim 5, wherein the gate metal layer corresponds to the gate electrode, at least one of the first metal layer and the second metal layer corresponds to at least one of the source electrode and the drain electrode, and the buffer layer corresponds to a passivation layer.

7. The display panel of claim 1, further comprising a driving circuit disposed on the plurality of pads.

8. The display panel of claim 1, wherein the third pad is configured to connect external testing equipment to a driving circuit disposed on the plurality of pads.

9. A display apparatus, comprising:
   a display panel including an active area in which a plurality of pixels is disposed and a non-active area including a plurality of pads connected to the active area;
   a driving circuit disposed on the plurality of pads,
   wherein the plurality of pads includes a first pad and a second pad which are separated from each other by a first distance in a first direction and a third pad which is separated from the first pad and the second pad by a second distance in a second direction, wherein the first pad and the second pad are disposed on a device region for an integrated circuit;
   a link line extending from a first end of the link line to a second end in the second direction, wherein the link line is disposed between the first pad and the second pad and connected to the third pad disposed in a test interface region, and wherein the first end of the link line is coupled to the third pad; and
   a metal layer disposed over the link line in the device region and between the first pad and the second pad,
   wherein at least one of the first pad, the second pad, and the third pad includes a gate metal layer, an insulating layer, a first metal layer, a second metal layer, a sensor metal layer, and a buffer layer, and
   wherein the metal layer disposed on the link line includes a same material as the first metal layer or the second metal layer.

10. The display apparatus of claim 9, wherein a link line connected to the first pad is disposed at one side of the third pad and a link line connected to the second pad is disposed at another side of the third pad.

11. The display apparatus of claim 9, wherein the gate metal layer corresponds to the link line.

12. The display apparatus of claim 9, wherein the insulating layer of the first pad and the second pad is extended between the link line and the metal layer disposed on the link line.

13. The display apparatus of claim 9, wherein at least one of the plurality of pixels includes:
    a transistor including a gate electrode, a source electrode, and a drain electrode; and
    a passivation layer disposed on the transistor.

14. The display apparatus of claim 13, wherein the gate metal layer corresponds to the gate electrode, at least one of the first metal layer and the second metal layer corresponds to at least one of the source electrode and the drain electrode, and the buffer layer corresponds to the passivation layer.

15. The display apparatus of claim 13, wherein the third pad is configured to connect external testing equipment to the driving circuit disposed on the plurality of pads.

* * * * *